United States Patent
Klaeui et al.

(10) Patent No.: US 7,242,604 B2
(45) Date of Patent: Jul. 10, 2007

(54) SWITCHABLE ELEMENT

(75) Inventors: Mathias Klaeui, Kreuzlingen (CH);
Rolf Allenspach, Adliswil (CH);
Pierre-Olivier Jubert, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 11/329,465

(22) Filed: Jan. 11, 2006

(65) Prior Publication Data

US 2006/0221677 A1    Oct. 5, 2006

(30) Foreign Application Priority Data

Jan. 13, 2005    (EP)    ................... 05405017

(51) Int. Cl.
*C11C 7/00*    (2006.01)
(52) U.S. Cl. ........................ 365/145; 365/148
(58) Field of Classification Search ................ 365/145, 365/148, 158
See application file for complete search history.

(56) References Cited

U.S. PATENT DOCUMENTS 6,724,652 B2 *    4/2004    Deak ........................... 365/158
7,102,477 B2 *    9/2006    Bland et al. ................. 335/302

* cited by examiner

*Primary Examiner*—Vu A. Le
(74) *Attorney, Agent, or Firm*—Louis P. Herzberg

(57) ABSTRACT

A memory element, logic element or sensor element is provided, which element comprises a switchable first magnetic component exhibiting a ferromagnetic or ferrimagnetic behaviour and comprising at least two magnetic domains with different magnetization directions and a domain wall between the magnetic domains. The element has electrodes operable to induce an electric current which at least partially flows through the domain wall with a current density high enough to cause the domain wall to reversibly propagate within the magnetic component. The first magnetic component may belong to a layered system further including a second magnetic component with a fixed magnetization and a non-magnetic spacer layer arranged between the first and second magnetic component. In such a layered system, the electrical resistance may depend on the relative orientation of the magnetization directions of the first and second magnetic component, due to the GMR or TMR effect.

20 Claims, 2 Drawing Sheets

SWITCHABLE ELEMENT

FIELD OF THE INVENTION

The invention relates to the field of devices containing ferromagnetic structures, where a number of stable and reproducibly attainable configurations (states) are used, such as in memory, logic and sensor elements.

BACKGROUND OF THE INVENTION

Magnetic spin switching in confined magnetic structures has applications for example in memory, logic and sensor device, in Spin-LEDs etc. Switching of a magnetic element is conventionally achieved by applying external magnetic fields, for example using a coil setup or local striplines. This has a number of drawbacks, since the field-generating striplines are cumbersome to fabricate and the currents used to create the magnetic field can lead to heating. Moreover, for noise reduction the striplines are often electrically insulated from the structures, so that separate lines have to be used for read-out and field generation, which increases the complexity of the system.

Typical novel non-volatile memory devices such as MRAM are cross-point memories. A memory cell is addressed and switched by applying a current pulse in the two orthogonal striplines (the word line and the bit line), which cross at the position of the addressed cell. The other cells that are positioned along these two striplines will feel the field generated by one stripline, i.e., typically 70% of the field present at the intended cell at which both current-carrying lines intersect. Thus the switching fields of the cells have to be extremely uniform and reproducible in order to obtain switching of only the addressed cell, and the operating window for the switching fields can be small. In other words, switching has to be reliably generated by two intersecting striplines but must not be generated by a single stripline. Proposals to overcome this obstacle have been made, a prominent one being Motorola's so-called "toggle switching". This approach, however, has the drawback of reducing the maximum speed of the device and requires at least one additional line per memory cell, thus compromising the ultimate integration density. In all Magnetoresistive Random Access Memory (MRAM) approaches, the switching fields of the cells increase as the lateral size is reduced, at least as long as the element sizes are large enough such that the superparamagnetic limit is not relevant. At the superparamagnetic limit the element size is so small that the energy differences between the magnetization states are not far above kT, where k is Boltzmann's constant and T is the temperature, and hence the temperature tends to destabilize the magnetic state. This requires higher currents in the striplines to switch the elements as the element size goes down. This effect in turn increases the unwanted effect of element heating and also of electromigration in the structure. Further, in general, with increased force of the switching field the switching field distribution of all elements increases as well.

An alternative approach is to use a multilayer pillar consisting of a Giant Magnetoresistance (GMR) stack (such as a Co/Cu/Co trilayer with different Co thicknesses) and switch the magnetically softer ferromagnetic layer by high current densities flowing across the stack. It has been found that electrons flowing from the magnetically hard to the magnetically soft layer align the layers parallel, and opposite currents align them antiparallel. While this simplifies the fabrication process, as read-out and writing are done using the same current path and consequently the same electrodes may be used, only GMR stacks can be used. Tunnelling Magnetoresistance (TMR) stacks, which exhibit a magnetoresistance effect based on a similar physical principle as GMR, may so far not be used, since their resistance is too high to obtain the current densities necessary for switching by spin-torque. However, due to the large energy needed for read-out and writing, GMR stacks are nowadays not considered for memory elements anymore, but rather the high-resistance TMR elements, such as NiFe/Al$_2$O$_3$/Co stacks.

Currently,-induced domain wall propagation is a known effect described for example in L. Berger, J. Appl. Phys. 55, 1954(1984), in M. Kläui et al., Appl. Phys. Lett. 83, 105 (2003), or A. Yamaguchi. Phys. Rev. Lett. 92, 077205(2004).

SUMMARY OF THE INVENTION

Thus, the present invention provides a switchable element, such as a memory element, logic element or sensor element with a magnetic component overcoming drawbacks of prior art memory elements, logic elements or sensor elements. The element has the advantage of being especially suited for fast switching or writing processes and for miniaturisation. The switching process is desired to exhibit a larger operating window for the switching fields. Preferably, a minimum number of leads should suffice for switching, writing and readout processes.

According to an aspect of the invention, a switchable element, for example a memory element, logic element or sensor element is provided, which comprises a switchable first magnetic component exhibiting a ferromagnetic or ferrimagnetic behaviour and comprising at least two magnetic domains with different magnetisation directions and a domain wall between the magnetic domains. The first magnetic component may be part of a layered system. The element has electrodes operable to induce an electric current which at least partially flows through the domain wall with a current density high enough to cause the domain wall to reversibly propagate within the magnetic component. "The current flows at least partially through the domain wall" means that the current induced via the electrodes has a non-zero flux across the domain wall. The element further comprises readout means which sense the electrical resistance of a structure comprising the first magnetic component, i.e. of the magnetic component or of a layered structure comprising the first magnetic component. By sensing the electrical resistance, the readout means are operable to distinguish between states with different domain wall positions.

According to another aspect of the invention, the invention also provides a memory device comprising a plurality of memory cells being elements according to the invention, which elements are wired so that an electric current which at least partially flows through the domain wall is inducible in a specifically addressed one of said elements. The first magnetic component may have a strip-like or similar shape.

According to an example embodiment, a first magnetic component has the shape of a laterally confined layer or a wire and is contacted by two current-inducing electrodes and two detection electrodes. The current-inducing electrodes and the detection electrodes are arranged in an interleaved configuration, i.e. one of the two detection electrodes is arranged in an interspace defined between the current-inducing electrodes. Due to the phenomenon of domain wall resistance—intrinsic to the wall or extrinsic due to material properties—the electrical resistance between the detection electrodes in such an arrangement depends on the position of the domain wall.

In alternative embodiments, a layered system including the first magnetic component may comprise, next to the switchable first magnetic component, a second magnetic component with a fixed magnetisation and a non-magnetic spacer layer arranged between the first and second magnetic component.

According to another aspect of the invention, the invention also provides a memory device—such as an MRAM—comprising memory elements according to the above outlined principle and comprising a wiring which makes possible to individually address the memory elements, such as a cross-point architecture wiring.

According to still another aspect of the invention, the invention also provides a method of switching a switchable element comprising a confined magnetic component. Such an element may be formed according to the principles outlined.

BRIEF DESCRIPTION OF THE DRAWINGS

Embodiments of the present invention will be described in the following description taken in conjunction with the accompanying drawings which are all schematic and not to scale, and in which.

DESCRIPTION OF THE INVENTION

Figure 1:
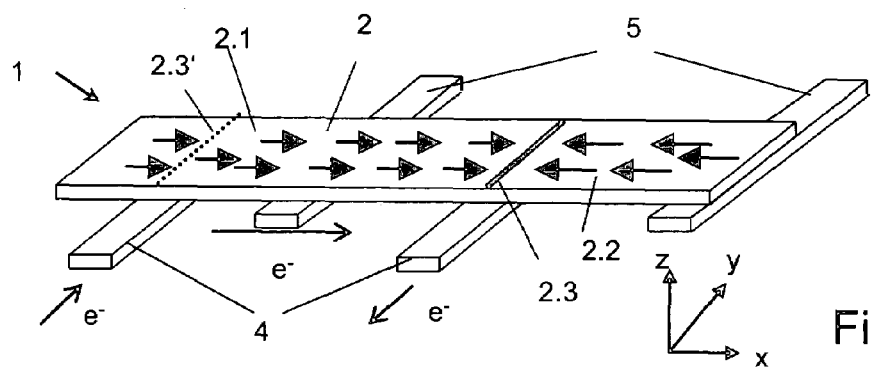
FIG. 1 shows an embodiment of the invention and at the same time illustrates the principle of switching by current induced domain wall propagation.

The present invention provides a switchable element, such as a memory element, logic element or sensor element with a magnetic component overcoming drawbacks of prior art memory elements, logic elements or sensor elements. The element has the advantage of being especially suited for fast switching or writing processes and for miniaturisation. The switching process is desired to exhibit a larger operating window for the switching fields. Preferably, a minimum number of leads should suffice for switching, writing and readout processes.

According to an example embodiment of the present invention, a switchable element, for example a memory element, logic element or sensor element is provided, which comprises a switchable first magnetic component exhibiting a ferromagnetic or ferrimagnetic behaviour, and comprising at least two magnetic domains with different magnetisation directions and a domain wall between the magnetic domains. The first magnetic component may be part of a layered system. The element has electrodes operable to induce an electric current which at least partially flows through the domain wall with a current density high enough to cause the domain wall to reversibly propagate within the magnetic component. "The current flows at least partially through the domain wall" means that the current induced via the electrodes has a non-zero flux across the domain wall.

The element further comprises readout means which sense the electrical resistance of a structure comprising the first magnetic component, i.e. of the magnetic component or of a layered structure comprising the first magnetic component. By sensing the electrical resistance, the readout means are operable to distinguish between states with different domain wall positions.

The invention also provides a memory device comprising a plurality of memory cells being elements according to the invention, which elements are wired so that an electric current which at least partially flows through the domain wall is inducible in a specifically addressed one of said elements. The first magnetic component may have a strip-like or similar shape.

According to a concept of the invention, in contrast to known approaches, switching is achieved by an electric current that induces domain wall propagation and not by a magnetic field. This is advantageous, since in a device with multiple memory elements it is possible to cause the current to flow through the domain wall of one memory element only, for example by means of a classical cross-point architecture, including a transistor for each element if necessary. Therefore, cross-talk effects are reduced. Every element of a device can be switched by injecting the same current pulse as long as this current pulse is higher and longer than the current pulse needed for the element with the highest threshold current density. This causes the operating window to be larger. It is limited upwards only by the current density where physical degradation of the material sets in.

Also in contrast to conventional field-induced switching, the current induced switching effect used according to the invention scales favourably with reduced size. It has been found experimentally that as magnetic structures are scaled down, the domain wall width becomes smaller. For this reason, one expects that domain wall propagation effects become more effective as magnetic structures become smaller.

According to an embodiment, the first magnetic component has the shape of a laterally confined layer or a wire and is contacted by two current-inducing electrodes and two detection electrodes. The current-inducing electrodes and the detection electrodes are arranged in an interleaved configuration, i.e. one of the two detection electrodes is arranged in an interspace defined between the current-inducing electrodes. Due to the phenomenon of domain wall resistance—intrinsic to the wall or extrinsic due to material properties—the electrical resistance between the detection electrodes in such an arrangement depends on the position of the domain wall.

An element has, in this context the shape of a "laterally confined layer" if its size in one dimension is only a fraction of the sizes in the other dimension—thus the element is layer-like —and it is laterally confined and thus for example structurally delimited from potential neighbouring elements in the same layer plane. An element has the shape of a "wire" if its size in two dimensions is only a fraction of the size in the third dimension, thus the element is wire-like.

In alternative embodiments, a layered system including the first magnetic component may comprise, next to the switchable first magnetic component, a second magnetic component with a fixed magnetisation and a non-magnetic spacer layer arranged between the first and second magnetic component. "Non-magnetic" in this text means "not ferromagnetic and not ferrimagnetic" but of course does not exclude paramagnetic or diamagnetic behaviour. In such a layered system, the electrical resistance may depend on the relative orientation of the magnetisation directions of the first and second magnetic component. This is due to the Giant Magnetoresistance (GMR) effect for systems with a metallic spacer layer and due to the Tunnelling Magnetoresistance (TMR) effect if the spacer layer is a thin enough electrical insulator.

In a layered system of this kind, the first magnetic component is both, the medium in which the switching process is directly induced by a current, and a part of the layered system of which the electrical resistance is sensed for readout. This allows for simple, uncomplicated element constructions: no separate elements—except the electrodes, which may be identical to the electrodes also needed for sensing—are needed for inducing a "write" process. Especially and importantly, no magnetic fields, which are hard to confine locally, are required for the write process.

Domain wall propagation may yield a drastic change in the magnetisation direction. A switching by 90° or even a complete 180° reversal of the magnetisation is possible. Therefore strong—maybe even maximum possible—GMR or TMR signals may be produced due to the approach according to the invention.

For a readout operation the direct correlation between the domain wall position and the resistance is used. The sensing of the electrical resistance of the layered system can be done in different ways, for example by absolute detection of resistance changes or changes relative to a fixed resistance value. Changes in resistance are detected qualitatively in order to provide the necessary information, typically whether the state is "0" or "1" or a particular one of more than two different states corresponding to more than two different domain wall positions. A quantitative measurement of resistance values or resistance value differences is not excluded by the invention but is often not required.

As to the electrode contacts, in a first variant the two current-inducing electrodes contact a peripheral portion of the first magnetic component and the second magnetic component or a pinning layer or contacting layer or the like in contact with it, so that an electric current induced between them traverses the first magnetic component, the spacer layer and the second magnetic component. Since the first electrode is arranged at a peripheral portion of the first magnetic component, by doing so the electric current at least partially flows in the first magnetic component layer and thereby may cause the domain wall to propagate. In this variant, the means for sensing the electrical resistance of the layered structure just sense the electrical resistance between the two current-inducing electrodes. The element, therefore, may be a two-terminal element.

In a second variant, the two current-inducing electrodes contact two different laterally peripheral sections of the first magnetic component, so that an electric current induced between them, referred to as "writing current", traverses the first magnetic component. The element further comprises a third electrode in contact with the second magnetic component or a pinning layer or contacting layer or the like in contact with it. The means for sensing the electrical resistance of the layered structure sense the electrical resistance between at least one of said two electrodes and the third electrode arranged such that an electric sensing current, also referred to as "readout current", induced between said at least one of the two electrodes and the third electrode traverses the first magnetic component, the spacer layer and the second magnetic component.

The first variant features the substantial advantage that in a memory device comprising a plurality of elements, only two leads are required per memory element. This allows a classical cross-point architecture. The first variant is suited for set-ups with electrically conducting spacer layers, i.e. GMR readouts, and for those set-ups with thin electrically insulating spacer layers, i.e. TMR readouts, where the current between the first and second magnetic component can be engineered to be high enough to displace the domain wall of the first magnetic component.

The second variant, in contrast, has three leads per element but does not require the writing current pulses to traverse the spacer layer. Therefore, the second variant is suited for set-ups with insulating spacer and a TMR readout where the resistance of the spacer layer may be too high for the writing current pulses with their often required high current densities.

In advantageous embodiments, two extremal domain wall positions are defined by the location of electrodes through which the current is applied and/or by geometrical variations such as notches or the like. This makes possible to define two clearly distinct states, corresponding to an information bit, between which one can reversibly switch back and forth. This overcomes the problem of element uniformity and reproducibility.

The invention also provides a memory device—such as an MRAM—comprising memory elements according to the above outlined principle and comprising a wiring which makes possible to individually address the memory elements, such as a cross-point architecture wiring.

The invention further provides a method of switching a switchable element comprising a confined magnetic component. Such an element may be formed according to the principles outlined above.

The memory element 1 of FIG. 1 comprises a first magnetic component 2 made of a ferromagnetic or ferrimagnetic material. The magnetic component 2 has the shape of a laterally confined layer, i.e. its size in one dimension (the z-dimension in the shown coordinate system) is smaller than the size in the other dimensions. The magnetic component has two magnetic domains 2.1, 2.2 with different, in this case opposed magnetisation directions, as indicated by the filled arrows. The magnetic component 2 is contacted by four electrodes, namely two current leads 4, also referred to as current-inducing electrodes, and two detection leads 5, also referred to as detection electrodes. The current leads 4 are operable to induce an electric current in the first magnetic component 2 as indicated by the light arrows. The arrows show the flow direction of the electrons, which direction is opposed to the technical current direction. The current, if its density is high enough, may shift the domain wall 2.3 due to current-induced domain wall propagation. In the figure, the domain wall 2.3 is shown in one of its extremal positions, the other extremal position being denoted by 2.3'. Since the current flows only between the two current leads 4, the domain wall can only be moved in between the two extremal domain wall positions 2.3, 2.3' regardless of the current density and current pulse length, as long as the current density is large enough to move the domain wall at all. These two positions code for "0" and "1" if the memory element 1 is part of a memory device. Notches or other geometrical variations could also be introduced to specifically define the two or more positions where the domain wall comes to a rest in response to the current pulse.

The detection leads 5 are used to detect whether or not the domain wall 2.3 is in the area between the two detection leads 5. The detection leads 5 are arranged in an interleaved configuration with the current leads 4 so that one of them is disposed in the interspace between the current leads 4, whereas the other one is not. Therefore, one of the extremal domain wall positions is outside the area between the detection leads 5 and one is inside. This allows for an easy determination of the domain wall position 2.3, 2.3' and therefore for an easy readout operation. Domain wall detection between the detection leads 5 is possible using different schemes, for example based on domain wall magnetoresistance where a different electrical resistance is observed depending on whether or not a domain wall 2.3 is between the detection leads 5 or on anisotropic magnetoresistance—if the magnetic material is of a kind exhibiting anisotropic magnetoresistance—where a different electrical resistance is observed for different magnetisation directions of the component magnetisation. If the first magnetic component 2 is part of a tri-layer also including a metallic nonmagnetic spacer layer and a pinned second magnetic component, a change in electrical resistance depending on the domain wall position may also be due to, for example current-in-plane-, giant magnetoresistance. In embodiments where anisotropic magnetoresistance and/or giant magnetoresistance dominates as effect accounting for the change of resistance, the current leads 4 and the detection leads 5 do not have to be interleaved. Instead, for example one pair of leads may be used as both, detection leads and current leads. In embodiments with a total of one pair of leads only and where detection is based on anisotropic magnetoresistance, the magnetisation directions of the magnetisations in the two domains are at an angle different from 180° with respect to each other. As yet another alternative, three leads may be present, one of which serves as both, a current lead and a detection lead.

In the shown configuration, all four leads 4, 5 are arranged in the same plane underneath the magnetic component layer, but this need not be the case. The leads 4, 5 may contact the first magnetic component 2 from different sides or all leads may be arranged atop the first magnetic component 2.

As an alternative to a layer-like shape, the first magnetic component 2 could also be a nano-wire, i.e. have a width that approximately corresponds to its thickness.

Figure 2:
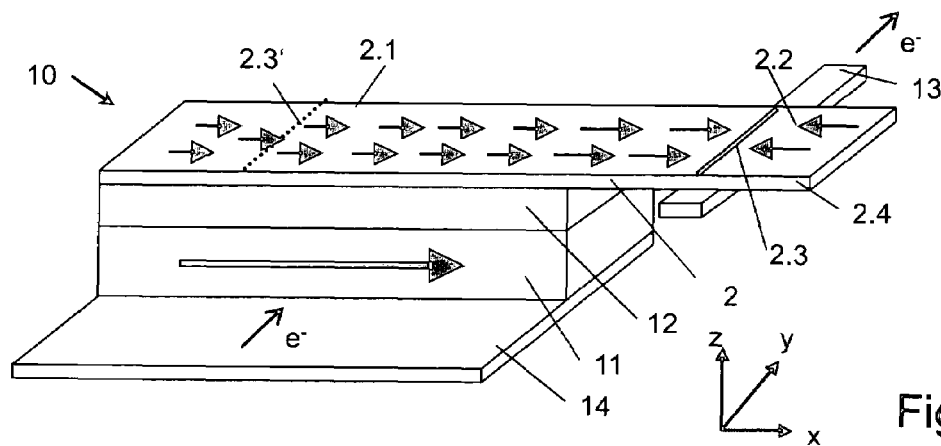
FIG. 2 depicts another embodiment of the invention.
Figure 3:
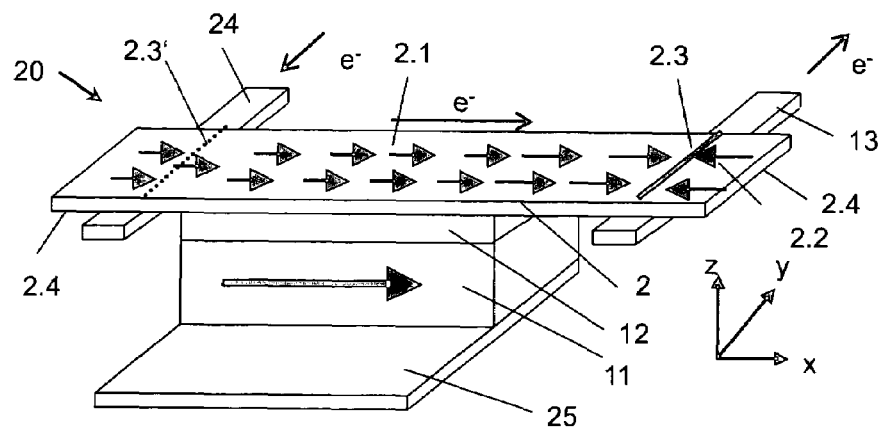
FIG. 3 shows a further embodiment of the invention.

The embodiments shown in FIGS. 2 and 3 concern memory elements based on a magnetic component/spacer layer/magnetic component trilayer. They, therefore, in their set-up resemble standard MRAM cells. For readout, they do use the principle that the electrical resistance of such a trilayer depends on the relative orientation of the magnetisation of the two ferromagnetic or ferrimagnetic layers. In this way, the domain wall position is detected indirectly—as in the mentioned case of anisotropic resistance measurements—by detecting a quantity that depends on the direction of the first magnetic component magnetisation.

The embodiment of a memory element 10 shown in FIG. 2 comprises a layered structure that includes a GMR or TMR stack, namely a trilayer with a first magnetic component 2, a spacer layer 12 and a second magnetic component 11. The first magnetic component 2 is strip-like and made of a ferromagnetic or ferrimagnetic material. Two magnetic domains 2.1, 2.2 with different (opposed in the shown embodiment; in practice it will often be perpendicular to each other or at a different angle) magnetisation directions are formed in the first magnetic component 2. The trilayer further includes a hard magnetic bottom layer 11 and a non-magnetic spacer layer 12. "Hard magnetic layer" does not mean that the coercive field of the magnetic layer has to be higher than a certain value but merely states that the magnetic fields necessarily present in a memory element,—fields induced by the currents flowing in the element, stray fields and the earth magnetic field—are not sufficient to substantially change the magnetisation of the layer, so that the magnetisation is fixed and defined.

As is known in the art, the electrical resistance of such a structure may depend on the relative orientation of the magnetic component magnetisation and the magnetic bottom layer magnetisation, if the spacer layer is thin enough.

The electric current for displacing the domain wall 2.3 is induced between a first electrode 13 contacting the first magnetic component 2 and a second electrode 14 being a bottom electrode adjacent to the hard ferromagnetic bottom layer 11. The electrons flow through the hard magnetic bottom layer 11 and the spacer layer 12 to the first magnetic component 2, and flow in an essentially horizontal direction, i.e. a direction parallel to the layer plane, through part of the first magnetic component 2 and may displace the domain wall 2.3.

The first electrode 13 contacts the first magnetic component 2 at a peripheral section thereof, so that the writing current has a larger proportion flowing horizontally. In the shown embodiment, the first magnetic component 2 even has a portion 2.4 which laterally (in x direction) extends beyond the dimension of the second magnetic component 11 and of the spacer layer 12 and in which the first magnetic component 2 is contacted by the first electrode 13.

In this embodiment, the current density in the first magnetic component 2 varies as a function of the position in the plane (the x position in the shown co-ordinate system) Whereas one extremal position of the domain wall 2.3—corresponding to the depicted position of the domain wall 2.3—in the shown configuration is defined by the position of the first electrode 13, the other extremal position 2.3' depends on the writing current pulse height and possibly also the pulse length, in addition to the material properties: The higher the current density, the further can the domain wall 2.3 shift to the x-direction, where the relative current flux density, compared to the total current flux density, is smaller. This allows tuning one extremal domain wall position by shaping the current pulse, which property may be advantageous. In embodiments where an exactly defined extremal domain wall position is desired, the first magnetic component 2 may have a feature that obstructs movement of the domain wall 2.3 beyond a certain defined position, for example a geometrical feature such as a notch or the like. By this, the propagation distance may further be tailored.

Another embodiment of a memory element 20 is shown in FIG. 3, where the reference numerals that are also used in FIG. 2 denote the same elements as in FIG. 2. The memory element 20 is different from the memory element 10 of FIG. 2 in that the second electrode 24 contacts the first magnetic component 2 directly, i.e. not via the spacer layer 12 and the second magnetic component 11. The writing current, therefore, flows essentially within the first magnetic component 2 and along the layer plane. Absent any special means for influencing the domain wall propagation distance, the extremal positions 2.3, 2.3' of the domain wall 2.3 are defined by the positions of the electrodes 13, 24. Nevertheless, they could still be influenced not to propagate as far as the electrode position or to propagate to an exactly defined position in the region of overlap between the electrode and the first magnetic component 2. This can be attained by additional means such as geometrical variations, i.e. notches or the like, or the pulse shape.

In the shown embodiment, the first magnetic component 2 has two portions 2.4 which laterally (in x direction) extend beyond the dimension of the first magnetic component 2 and of the spacer layer 12 and in which the first magnetic component 2 is contacted by the first electrode 13 and the second electrode 24, respectively.

A third electrode 25 contacting the second magnetic component 11 is provided for readout purposes. For a readout process determining the state of the layered structure, the resistance between the first and/or the second electrode 13, 24 on one hand and the third electrode 25 on the other hand is sensed.

Whereas the spacer layer 12 of both, the embodiment of FIG. 2 and of FIG. 3 may either be metallic or made of an electrically insulating material, the currents between the first and second magnetic components in the latter case being tunnelling currents, the embodiment of FIG. 3 is specifically suited for layered structures with electrical insulators as spacer layer 12, since only a small sensing current for sensing the electrical resistance needs to transcend the barrier which is due to the fact that the insulating spacer layer as such is electrically insulating.

Both embodiments may be provided on a substrate, such as a Si substrate. The first magnetic component 2 may be permalloy, i.e. a Fe—Ni-compound with a low anisotropy and therefore low coercive fields, a magnetic semiconductor or any other suitable ferromagnetic or ferrimagnetic compound. The thickness (i.e. dimension in z direction) of the layer may vary within a larger range; for permalloy layers, thicknesses between 5 nm and 30 nm may be appropriate. The spacer layer 12 may be any non-magnetic layer, for example Cu or another metal or possibly a semiconducting material for GMR readout, the thickness in this case typically being between 0.5 nm and 10 nm. If the spacer layer 12 is made of an insulating material, its thickness is usually between one atomic layer and about 1 nm. Materials of such spacer layers may be $Al_2O_3$, MgO or any other suitable insulating material. The second magnetic component 11 may be any suitable ferromagnet with a sufficiently high coercive field so that no undesired switching occurs. It may, for example, be made in the manner known from state of the art pinned layers of MRAM devices or GMR or TMR sensing heads, such as a 2 nm Co layer disposed on a thin layer of an antiferromagnet, such as FeMn, NiO, or a synthetic antiferromagnet such as an exchange-coupled bilayer with essentially equal but opposite magnetization of the two ferromagnets such as Co/Ru/Co etc. The electrodes (or contact leads) may for example be made from materials known for this purpose from CMOS technology, such as Cu or Al.

The current densities to move domain walls are currently still rather high, typically $10^{12}$ A/m$^2$ for low coercive field metallic ferromagnets such as permalloy. In magnetic semiconductors, however, these current densities can be reduced by a factor of at least 100 to 1000. It may, however, be expected that optimisation of materials, geometries, or current pulse shapes will yield further improvements in this respect.

Figure 4:
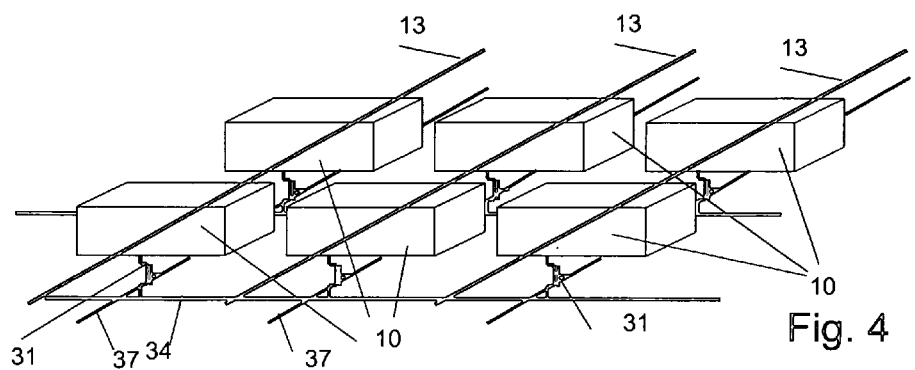
FIG. 4 shows a possible simplified wiring scheme of a memory device comprising elements according to the embodiment of FIG. 2.

In FIG. 4, schematically six memory elements 10 as in FIG. 2 serving as memory cells of a storage device are shown. The memory element is wired according to the known cross-point architecture including a transistor. The first electrodes 13 directly serve as one set of contact lines (for example the bit lines), whereas the second electrodes (arranged at the bottom side of the elements 10; not visible in the figure) are contacted via a transistor 31 on top of which the memory element is formed. The corresponding second set of contact lines (the word lines which cross the bit lines at the place of every memory element) is denoted by 34 in the figure. The transistor inhibits parallel (shunting) conduction through several memory elements which conduction could tamper both, the read and write processes. Also shown in the figure are gate contact lines 37 by which the transistors of a certain bit line are selectively opened for a "write" or "readout" process concerning a memory cell of the bit line.

Figure 5:
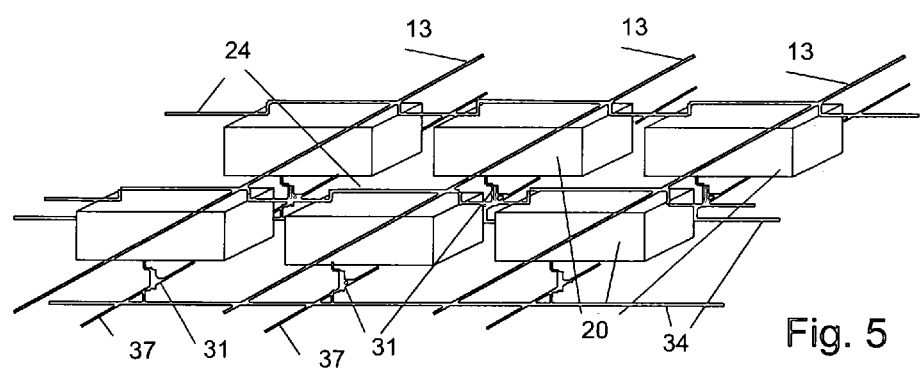
FIG. 5 depicts a possible wiring scheme of a memory device comprising elements according to the embodiment of FIG. 3.

For a "write" or a "readout" process, each memory element 10 may be addressed individually by choosing the word line and the bit line of the memory element The memory elements 20 of the storage device shown in FIG. 5 are of the type described with reference to FIG. 3. The leads forming the first and second electrodes 13, 24 are wired in a cross-point architecture. A cross-point architecture is also provided between the first and third electrodes. The third electrodes are contacted via contact lines 34 via transistors 31. Therefore, individual addressing of a memory element 20 is possible for a write process as well as for a readout process. As in the above described embodiment, in order to carry out a "write" or "readout" process, the transistors of the concerned bit line are opened.

The transistors of a memory device may be provided in accordance with any known technology, for example with the CMOS technology which may readily be implemented on a Si substrate.

Even though for many configurations transistors for every cell are provided, this need not be always the case. For example, each memory element could include a transition between two layers that functions as a diode with a defined breakthrough voltage. Whereas for the read process a smaller voltage, that is below the breakthrough voltage, is applied in the forward direction, the current pulse for the 'write' process is such that the voltage across the element is below the breakthrough voltage for writing in one direction, corresponding to the 'forward' direction of the diode, and it is above the breakthrough voltage but below two times the breakthrough voltage for a write process in the other direction, corresponding to the 'reverse' direction of the diode. In this way, conduction across more than two cells—in fact, at least three cells do participate in shunting—can be prevented. Therefore, in such a configuration a cross-point architecture without any transistors may be used.

Also, configurations may be possible where transistors are required for the read process only or for the write process only. The latter could for example include a series connection of a number of memory cells for readout processes.

Figure 6:
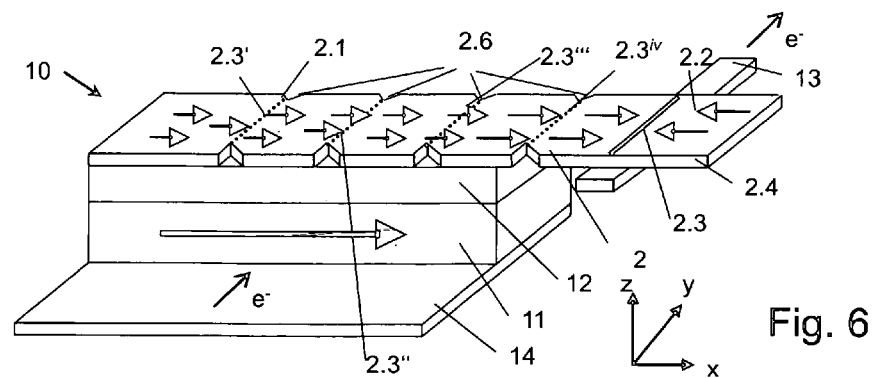
FIG. 6 depicts yet another embodiment of the invention.

In FIG. 6, a variant of the embodiment of FIG. 2 is shown. Same reference numerals as in FIG. 2 denote same elements. As in the previously described embodiments, the first magnetic component 2 in the embodiment of FIG. 6 has the shape of a—for example strip like—laterally confined layer. It further has a plurality of indentations 2.6—as an alternative, it could comprise protrusions—which act as geometrical features pinning the domain wall at defined positions 2.3', 2.3", 2.3''', 2.3$^{iv}$ by accounting for an increased resistance against domain wall propagation. In the shown embodiment, four pairs of indentations together with the position of the first electrode 13 define distinct domain wall positions, so that the element shown has five defined states. In alternative embodiments, a different number of states may be defined, for example three, four, six, eight, ten, etc.

A first magnetic component 2 comprising geometrical or other structural features (for example changes in material composition) that define domain wall positions by accounting for a locally increased resistance may also be used in connection with the set-ups as shown in FIGS. 1 and 3.

Although referring to FIGS. 4 and 5 a storage device has been described, the element according to the invention may also be used as a logic element or a sensing element. A sensing device according to the invention may for example be a read head of a magnetic storage or memory device, which read head comprises a GMR or TMR sensor, where the first magnetic component is—as in the shown embodiment—an outer layer of a layered structure and serves as sensing layer and the second magnetic component is a pinned layer. The sensing layer of a read head is a magnetically soft layer that changes its magnetisation direction if it is subject to a stray field produced by an information bit of a magnetic memory, such as a hard disc. The pinned layer is a magnetically hard layer with a defined magnetisation direction, so that the relative orientation of the sensing layer and the pinned layer magnetisations are indicative of the memory stray field. The pinned layers, however, tend to tire, i.e. sections of them lose, after a certain time, their fixed magnetisation direction. By applying a current ("write") pulse, the pinned layer may be again brought into a defined state. Also the sensing layers may tire, i.e., certain regions do not react to the stray field in the desired manner any more. A sensing head may, according to the invention, also be made in a manner that a 'write' pulse may be applied to the sensing layer. The "write" procedure for the pinned layer and/or the sensing layer may be repeated regularly in a sensing head according to the invention, thus repeatedly refreshing the sensing head.

A 'write' procedure according to the invention could also be used in a sensing head which is configured such that potential stray fields of a magnetic storage or memory device in the 'read' procedure cause a displacement of a domain wall in the sensing layer and are thus detected in the manner described above referring to FIG. 2, 3, or 6. The 'write' procedure according to the invention could be used to place the domain wall, after the read procedure, in its initial position ('to arm the trigger').

The embodiments disclosed above are by no means the only way to carry out the invention but may be altered in many ways. For example, in all embodiments except if used as a sensing head, the sequence of the layers may be reversed, i.e. the first magnetic component may be buried by the spacer layer and the second magnetic component. Also, the layered structure may comprise further layers introduced for reasons in connection with fabrication, growth or parameter optimisation, protection, etc.

Further, the readout process need not be based on one physical principle (such as TMR or GMR) only but may rely on a combination of principles. For example, domain wall magnetoresistance and/or anisotropic magnetoresistance may contribute to a readout signal. In addition, the read-out process need not sense the resistance (or changes in resistance) perpendicular to the layer plane but may, especially readout processes based on GMR, alternatively sense the resistance parallel to the layer plane or a combination of these variants.

Also, the write process, though primarily due to current induced domain wall propagation, may be aided by stray fields, other magnetic fields or other effects.

Further, the shapes of the layers may be different from the relatively simple rectangular shapes shown in the drawings. Also the domain pattern may be more complicated than shown, and the domain walls may differ and are not necessarily 180 degree walls.

Although in the shown embodiments the magnetic layers are magnetised "in-plane",i.e. the magnetisation is parallel to the layer plane, this need not be the case. Also out-of-plane magnetised layers are suitable for the invention. Various other embodiments may be envisaged. The embodiments can be combined together in whole or in part.

Variations described for the present invention can be realized in any combination desirable for each particular application. Thus particular limitations, and/or embodiment enhancements described herein, which may have particular advantages to the particular application need not be used for all applications. Also, not all limitations need be implemented in methods, systems and/or apparatus including one or more concepts of the present invention. The invention also includes apparatus for implementing steps of a method of this invention, and methods implementing functions of an apparatus of this invention.

It is noted that the foregoing has outlined some of the more pertinent objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

What is claimed, is:

1. A switchable element comprising a structure that comprises a first magnetic component exhibiting a ferromagnetic or ferrimagnetic behaviour, the first magnetic component comprising at least two magnetic domains with different magnetisation directions and a domain wall between the magnetic domains, the element comprising current-inducing electrodes operable to induce an electric current which at least partially flows across the domain wall with a current density high enough to cause the domain wall to reversibly propagate within the first magnetic component, further comprising readout means for sensing the electrical resistance of the structure and thereby distinguishing between states with different domain wall positions.

2. An element according to claim 1, wherein the first magnetic component has the shape of one of a laterally confined layer and a wire.

3. An element according to claim 1, wherein the structure is a layered structure, defines a layer plane and comprises a second magnetic component having a defined magnetisation, and further comprises a non-magnetic spacer layer arranged between the first magnetic component and the second magnetic component and wherein the electrical resistance of the layered structure depends on the relative orientation of the magnetisation of the first and the second magnetic component.

4. A switchable element according to claim 3, wherein the spacer layer comprises an electrically insulating material, and wherein the electrical resistance of the layered structure is dependent on the relative orientation of the first and the second magnetic component due to Tunnelling Magnetoresistance.

5. A switchable element according to claim 3, wherein the spacer layer comprises an electrically conducting material and wherein the electrical resistance of the layered structure is dependent on the relative orientation of the first and the second magnetic component due to Giant Magnetoresistance.

6. A switchable element according to claim 3, wherein the current-inducing electrodes comprise two electrodes that are arranged such that an electric current induced between them traverses the first magnetic component, the spacer layer and the second magnetic component, and wherein the readout means for sensing the electrical resistance of the layered structure comprises means for sensing the electrical resistance between the two current-inducing electrodes.

7. A switchable element according to claim 3, wherein the current-inducing electrodes comprise two electrodes that are in contact with two peripheral sections of the first magnetic component and wherein the readout means for sensing the electrical resistance of the layered structure comprises means for sensing the electrical resistance between at least one of said two electrodes and a third electrode arranged such that an electric sensing current induced between said at least one of the two electrodes and the third electrode traverses the first magnetic component, the spacer layer and the second magnetic component.

8. A switchable element according to claim 3, wherein a lateral dimension of the first magnetic component extends beyond a lateral dimension of at least one of the spacer layer and of the second magnetic layer in at least one portion, and wherein at least one of the electrodes (13) contacts the first magnetic component in that portion.

9. A switchable element according to claim 2, wherein the readout means for sensing an electrical resistance comprises two detection electrodes, wherein the current-inducing electrodes are arranged at different lateral positions defining an interspace between the current-inducing electrodes, wherein one of the two detection electrodes is arranged between the current-inducing electrodes and contacts the first magnetic component in the interspace, and wherein the other one of the detection electrodes is arranged outside of the interspace.

10. A switchable element according to claim 1, wherein the first magnetic component comprises at least one structural feature for pinning the domain wall at a defined position.

11. A memory device comprising a plurality of elements according to claim 1, and being wired so that an electric current which at least partially flows through the domain wall is inducible in a specifically addressed one of said elements.

12. A method of switching a switchable element comprising a first magnetic component, wherein different magnetisation states of the first magnetic component correspond to different states of the switchable element, the first magnetic component comprising two magnetic domains with different magnetisation directions and a domain wall between the magnetic domains, the method comprising the step of inducing an electric current with a current density high enough to cause the domain wall to reversibly propagate within the first magnetic component and thereby switching between different states.

13. A method according to claim 12, wherein the switchable element is selected to be a memory cell of a memory device, and wherein said switching is a writing of an information bit of said memory device.

14. An element according to claim 2, wherein the structure is a layered structure, defines a layer plane and comprises a second magnetic component having a defined magnetisation, and further comprises a non-magnetic spacer layer arranged between the first magnetic component and the second magnetic component and wherein the electrical resistance of the layered structure depends on the relative orientation of the magnetisation of the first and the second magnetic component.

15. An apparatus to switch a switchable element comprising: a first magnetic component, wherein different magnetization states of the first magnetic component correspond to different states of the switchable element, the first magnetic component comprising two magnetic domains with different magnetisation directions and a domain wall between the magnetic domains, the apparatus comprising means for inducing an electric current with a current density high enough to cause the domain wall to reversibly propagate within the first magnetic component and thereby switching between different states.

16. An apparatus method according to claim 15, wherein the switchable element is selected to be a memory cell of a memory device, and wherein said switching is a writing of an information bit of said memory device.

17. A switchable element according to claim 10, wherein said structural feature comprising one of a lateral indentation and protrusion.

18. A switchable element according to claim 4, wherein the current-inducing electrodes comprise two electrodes that are arranged such that an electric current induced between them traverses the first magnetic component, the spacer layer and the second magnetic component, and wherein the readout means for sensing the electrical resistance of the layered structure comprises means for sensing the electrical resistance between the two current-inducing electrodes.

19. A switchable element according to claim 5, wherein the current-inducing electrodes comprise two electrodes that are in contact with two peripheral sections of the first magnetic component and wherein the readout means for sensing the electrical resistance of the layered structure comprises means for sensing the electrical resistance between at least one of said two electrodes and a third electrode arranged such that an electric sensing current induced between said at least one of the two electrodes and the third electrode traverses the first magnetic component, the spacer layer and the second magnetic component.

20. A switchable element according to claim 7, wherein a lateral dimension of the first magnetic component extends beyond a lateral dimension of at least one of the spacer layer and of the second magnetic layer in at least one portion, and wherein at least one of the electrodes (13) contacts the first magnetic component in that portion.

* * * * *